(12) United States Patent
Alshinnawi et al.

(10) Patent No.: US 9,451,722 B2
(45) Date of Patent: Sep. 20, 2016

(54) RACK MOUNTABLE NETWORK SWITCH

(71) Applicant: LENOVO ENTERPRISE SOLUTIONS (SINGAPORE) PTE. LTD., Singapore (SG)

(72) Inventors: Shareef F. Alshinnawi, Durham, NC (US); Gary D. Cudak, Creedmoor, NC (US); Edward S. Suffern, Chapel Hill, NC (US); J. Mark Weber, Wake Forest, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 156 days.

(21) Appl. No.: 14/275,142

(22) Filed: May 12, 2014

(65) Prior Publication Data

US 2015/0327381 A1    Nov. 12, 2015

(51) Int. Cl.
  H05K 7/00    (2006.01)
  H05K 7/14    (2006.01)
  H05K 5/02    (2006.01)

(52) U.S. Cl.
  CPC .......... *H05K 7/1492* (2013.01); *H05K 5/0217* (2013.01); *H05K 5/0247* (2013.01)

(58) Field of Classification Search
  CPC ............. H05K 5/0217; H05K 5/0247; H01R 13/648; G06F 1/16; H04M 1/00
  USPC .......... 361/679.02, 727, 781, 785, 789, 826, 361/832, 837; 379/438; 439/59, 536, 607; 714/43
  See application file for complete search history.

(56) References Cited

U.S. PATENT DOCUMENTS 5,761,033 A * 6/1998 Wilhelm .............. H05K 7/1429
                                                    361/679.33
5,939,673 A    8/1999 Rentmore (Continued)

FOREIGN PATENT DOCUMENTS

FR    2841055 A1    12/2003
JP    2007288869 A  11/2007
JP    11341619 A    12/2010

OTHER PUBLICATIONS

Murray, G., et al., "Design and Construction of the Fibre System for FMOS", In SPIE Proceedings, *Ground-based and Airborne Instrumentation for Astronomy II*, vol. 7014, Aug. 2008, 12 pages, International Society for Optics and Photonics, Bellingham, Washington, USA.

(Continued)

*Primary Examiner* — Courtney Smith
*Assistant Examiner* — Zhengfu Feng
(74) *Attorney, Agent, or Firm* — Brandon C. Kennedy; Katherine S. Brown; Kennedy Lenart Spraggins LLP

(57) ABSTRACT

A rack mountable network switch, the rack mountable network switch comprising: a faceplate; a switch chassis coupled to the faceplate, the switch chassis including a plurality of connector openings on a surface of the switch chassis that is perpendicular to the faceplate; a plurality of moveable plug receptacles coupled to a printed circuit board ('PCB') mounted inside the switch chassis; and a mechanical positioning component coupled to the moveable plug receptacles, the mechanical positioning component configured to position the moveable plug receptacles to extrude from the switch chassis via the connector openings when the mechanical positioning component is in a first position, the mechanical positioning component further configured to position the moveable plug receptacles inside the switch chassis when the mechanical positioning component is in a second position.

13 Claims, 7 Drawing Sheets

(56) References Cited

U.S. PATENT DOCUMENTS

| | | | | |
|---|---|---|---|---|
| 6,205,030 | B1* | 3/2001 | Price | H05K 5/0273 235/492 |
| 6,373,944 | B1* | 4/2002 | Beavers | H01R 31/005 379/438 |
| 6,830,466 | B2 | 12/2004 | Mendoza | |
| 2002/0068481 | A1* | 6/2002 | Flickinger | H05K 9/0058 439/607.23 |
| 2003/0002261 | A1* | 1/2003 | Berry | H05K 7/1489 361/727 |
| 2003/0161108 | A1* | 8/2003 | Bright | G02B 6/4201 361/707 |
| 2005/0074222 | A1 | 4/2005 | Hayashi et al. | |
| 2005/0201073 | A1* | 9/2005 | Pincu | H04Q 1/02 361/797 |
| 2006/0246761 | A1 | 11/2006 | Ostendorp | |
| 2010/0216335 | A1* | 8/2010 | Cobb | H01R 13/6485 439/540.1 |
| 2012/0034798 | A1 | 2/2012 | Khemakhem et al. | |
| 2012/0081850 | A1* | 4/2012 | Regimbal | G06F 1/189 361/679.02 |
| 2014/0195859 | A1* | 7/2014 | Dickenson | G06F 11/183 714/43 |
| 2015/0271938 | A1* | 9/2015 | Sechrist | H05K 5/0247 361/822 |

OTHER PUBLICATIONS

Karim, M. F., et al., "A tunable bandstop filter via the capacitance change of micromachined switches", *Journal of Micromechanics and Microengineering*, vol. 16, No. 4, Apr. 2006, pp. 851-861, IOP Publishing Ltd, UK, DOI:10.1088/0960-1317/16/4/023.

PCI Industrial Computer Manufacturers Group (PICMG): "Dual Star (ATCA Backplane)", Product Listing, picmg.org (online publication), 7 pages, Oct. 2013, URL: http://members.picmg.org/kshowcase/view/catalogs_by_category?categories=21737b298590113431f21c720ff8befec5415769.

* cited by examiner

FIG. 1 - PRIOR ART

RACK MOUNTABLE NETWORK SWITCH

BACKGROUND OF THE INVENTION

1. Field of the Invention

The field of the invention is computing hardware, or, more specifically, a rack mountable network switch.

2. Description of Related Art

Modern computing systems may include racks of servers inter-connected to switches using cables. In current computing systems, however, if a switch needs to be replaced, the cable wiring harness needs to be undone, the cables need to be unplugged, and the switch replaced. The cables then need to be reinstalled and the wiring harness redone. During this operation, cable connectors can become damaged or the cable bend radius can be exceeded causing loss of signal integrity.

SUMMARY OF THE INVENTION

A rack mountable network switch, the rack mountable network switch comprising: a faceplate; a switch chassis coupled to the faceplate, the switch chassis including a plurality of connector openings on a surface of the switch chassis that is perpendicular to the faceplate; a plurality of moveable plug receptacles coupled to a printed circuit board ('PCB') mounted inside the switch chassis; and a mechanical positioning component coupled to the moveable plug receptacles, the mechanical positioning component configured to position the moveable plug receptacles to extrude from the switch chassis via the connector openings when the mechanical positioning component is in a first position, the mechanical positioning component further configured to position the moveable plug receptacles inside the switch chassis when the mechanical positioning component is in a second position.

The foregoing and other objects, features and advantages of the invention will be apparent from the following more particular descriptions of example embodiments of the invention as illustrated in the accompanying drawings wherein like reference numbers generally represent like parts of example embodiments of the invention.

DETAILED DESCRIPTION OF EXAMPLE EMBODIMENTS

Figure 1:
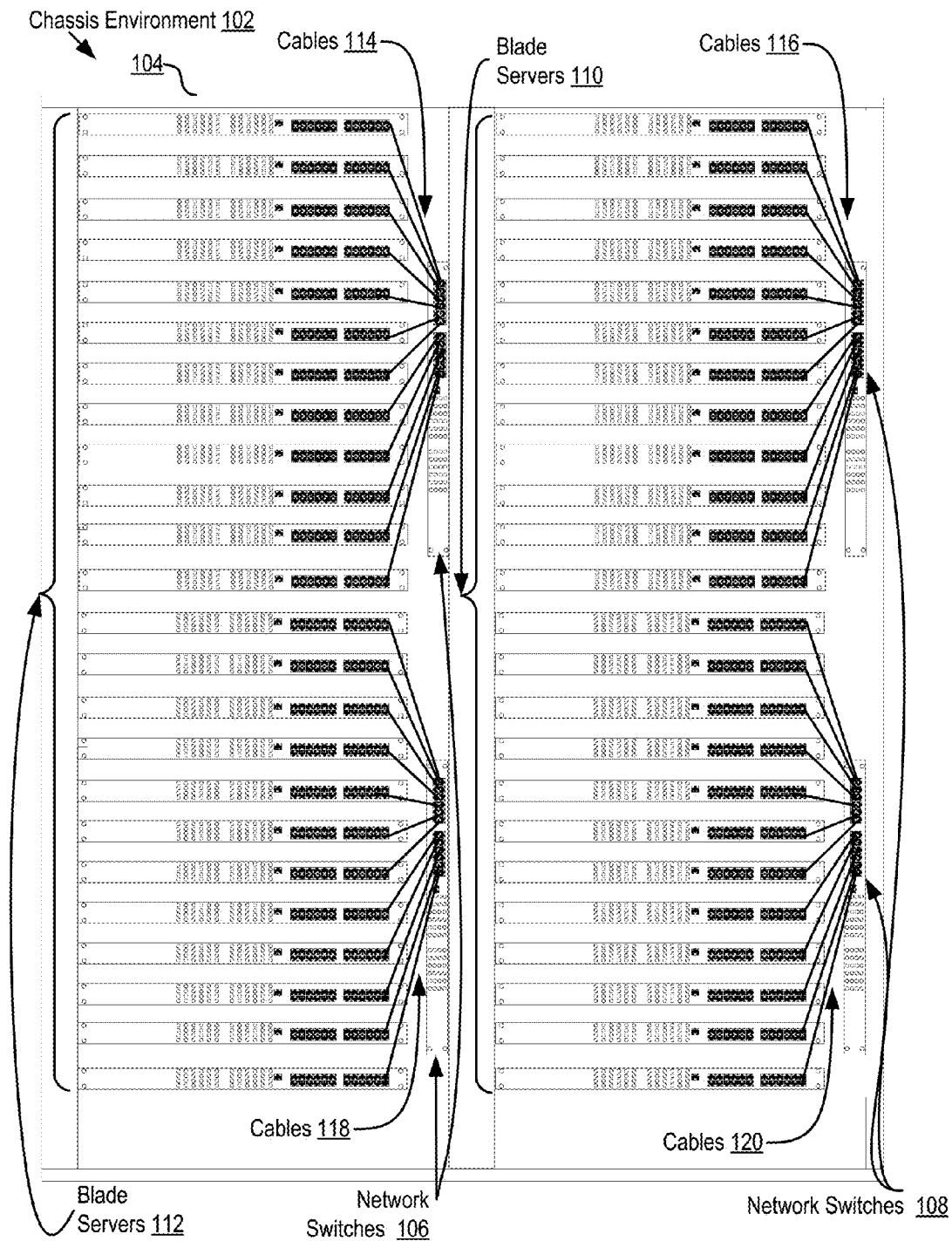
FIG. 1 sets forth a prior art diagram of a chassis environment.

Example rack mountable network switches and related hardware in accordance with the present invention are described with reference to the accompanying drawings, beginning with FIG. 1. FIG. 1 sets forth a prior art diagram of a chassis environment (102). A 'chassis environment,' as the term is used in this specification, refers generally to a blade server system. The chassis environment (102) in the example depicted in FIG. 1 is installed in a two-bay chassis and includes a plurality of blade servers (110, 112) and network switches (106, 108).

In the chassis environment (102) depicted in FIG. 1, the blade servers (110, 112) are installed in cabinet bay (104) of the example chassis environment (102). Such blade servers (110, 112) are computing devices implemented in blade form factor. The blade servers (110, 112) may share access to media trays, power supplies, or other computing components. The blade servers (110, 112) may also be connected to one another and to a chassis management module for data communications through a local area network ('LAN'), which may be embodied as a small network installed within the chassis environment (102).

In the chassis environment (102) depicted in FIG. 1, each of the blade servers (110, 112) is connected to a network switch (106, 108) via a data communications cables (114, 116, 118, 120). Readers will appreciate that such cables (114, 116, 118, 120) are coupled to the network switches (106, 108) via a faceplate of a particular network switch (106, 108) that is physically parallel to a faceplate on each of the blade servers (110, 112). As such, in order to remove one of the network switches (106, 108) from the chassis environment (102), all of the cables (114, 116, 118, 120) must be manually disconnected from the network switch (106, 108) to be replaced, such that the network switch (106, 108) can be removed from its slot in the cabinet bay (104).

Figure 2:
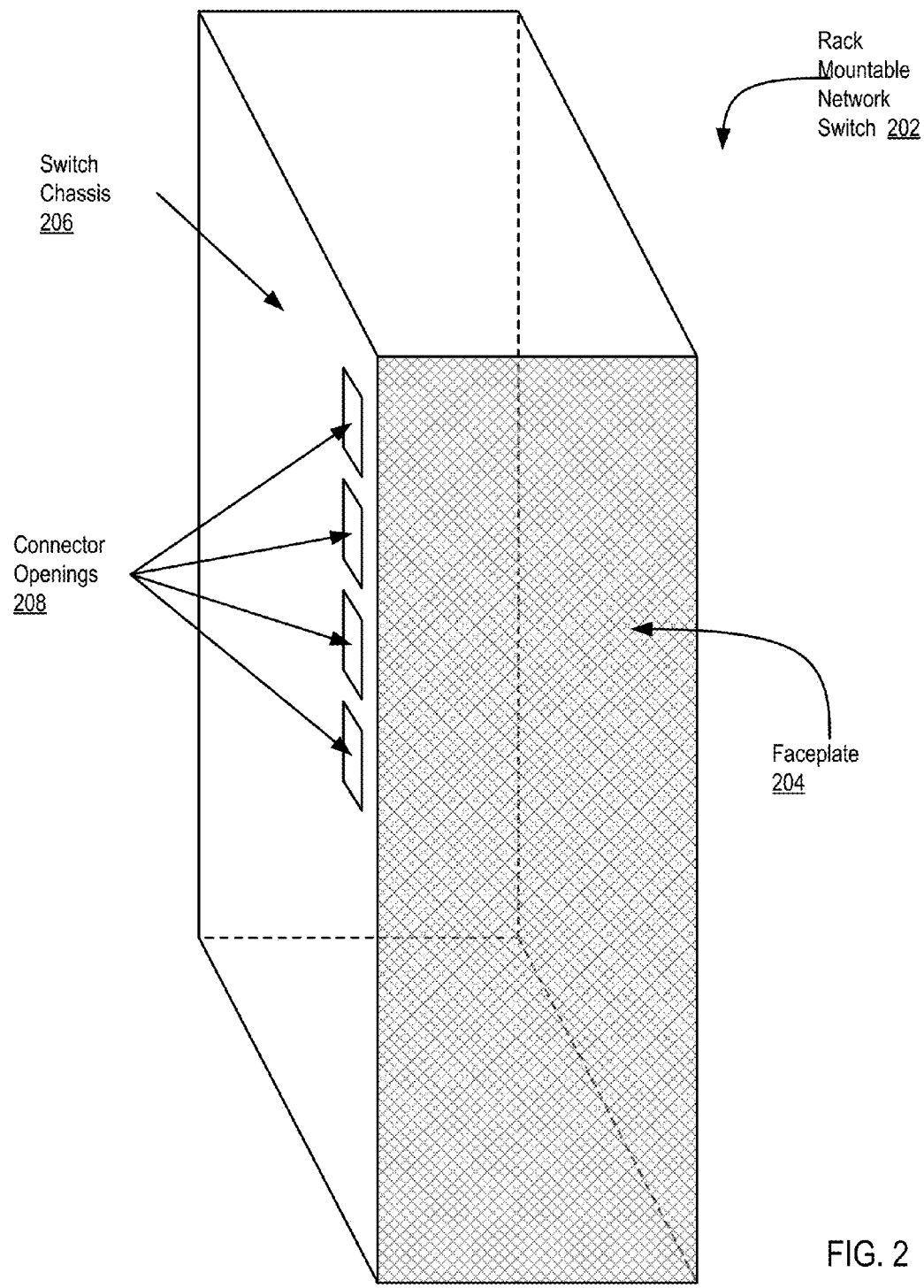
FIG. 2 sets forth a diagram of a rack mountable network switch according to embodiments of the present invention.

FIG. 2 sets for a diagram of a rack mountable network switch (202) according to embodiments of the present invention. The rack mountable network switch (202) of FIG. 2 is a computer networking device that is used to connect devices together on a computer network. The rack mountable network switch (202) of FIG. 2 is 'rack mountable' as the network switch (202) may be mounted within a rack such as a blade center that includes a plurality of blade servers that are coupled to the rack mountable network switch (202) via a plurality of network cables.

The rack mountable network switch (202) of FIG. 2 includes a faceplate (204). In the example depicted in FIG. 2, the faceplate (204) represents a surface of the rack mountable network switch (202) that is viewable when looking at the front of a rack that the rack mountable network switch (202) is mounted within. The faceplate (204) may be configured to enable the display of information associated with the operation of the rack mountable network switch (202). For example, the faceplate (204) may include indicator lights identifying whether data is flowing through one or more output ports of the rack mountable network switch (202), indicator lights indicating whether power is being delivered to the rack mountable network switch (202), and so on.

The rack mountable network switch (202) of FIG. 2 also includes a switch chassis (206) that is coupled to the faceplate (204). The switch chassis (206) represents a physical housing for the computing components that form the rack mountable network switch (202). The switch chassis (206) may be designed to conform to a predetermined physical form factor that enables the rack mountable network switch (202) to be inserted into a rack such as a blade center. The switch chassis (206) of FIG. 2 includes a plurality of connector openings (208) on a surface of the switch chassis (206) that is perpendicular to the faceplate (204). The plurality of connector openings (208) depicted in FIG. 2 may be embodied as holes in the switch chassis (206) through which computing components within the rack mountable network switch (202) may be coupled to computing components within another computing device. For example, the plurality of connector openings (208) may be embodied as holes in the switch chassis (206) through which a computing component within the rack mountable network switch (202) may be coupled to a blade server via a network cable.

Although not illustrated in FIG. 2, the rack mountable network switch (202) of FIG. 2 can also include a plurality of moveable plug receptacles coupled to a printed circuit board ('PCB') mounted inside the switch chassis (206). The PCB mounted inside the switch chassis (206) may include computing components such as one or more CPUs, computer memory, slots for inserting computer memory modules, connectors to other peripherals, computer busses, and so on. In such an example, the PCB mounted inside the switch chassis (206) may be coupled to the moveable plug receptacles via a cable or other mechanism that allows for signals to be exchanged between a network cable that is inserted into a plug receptacle and one or more devices on the PCB that is mounted inside the switch chassis (206).

Although not illustrated in FIG. 2, the rack mountable network switch (202) of FIG. 2 also includes a mechanical positioning component coupled to the moveable plug receptacles. The mechanical positioning component is configured to position the moveable plug receptacles to extrude from the switch chassis (206) via the connector openings (208) when the mechanical positioning component is in a first position. The mechanical positioning component is further configured to position the moveable plug receptacles inside the switch chassis (206) when the mechanical positioning component is in a second position, as described in greater detail below.

Figure 3:
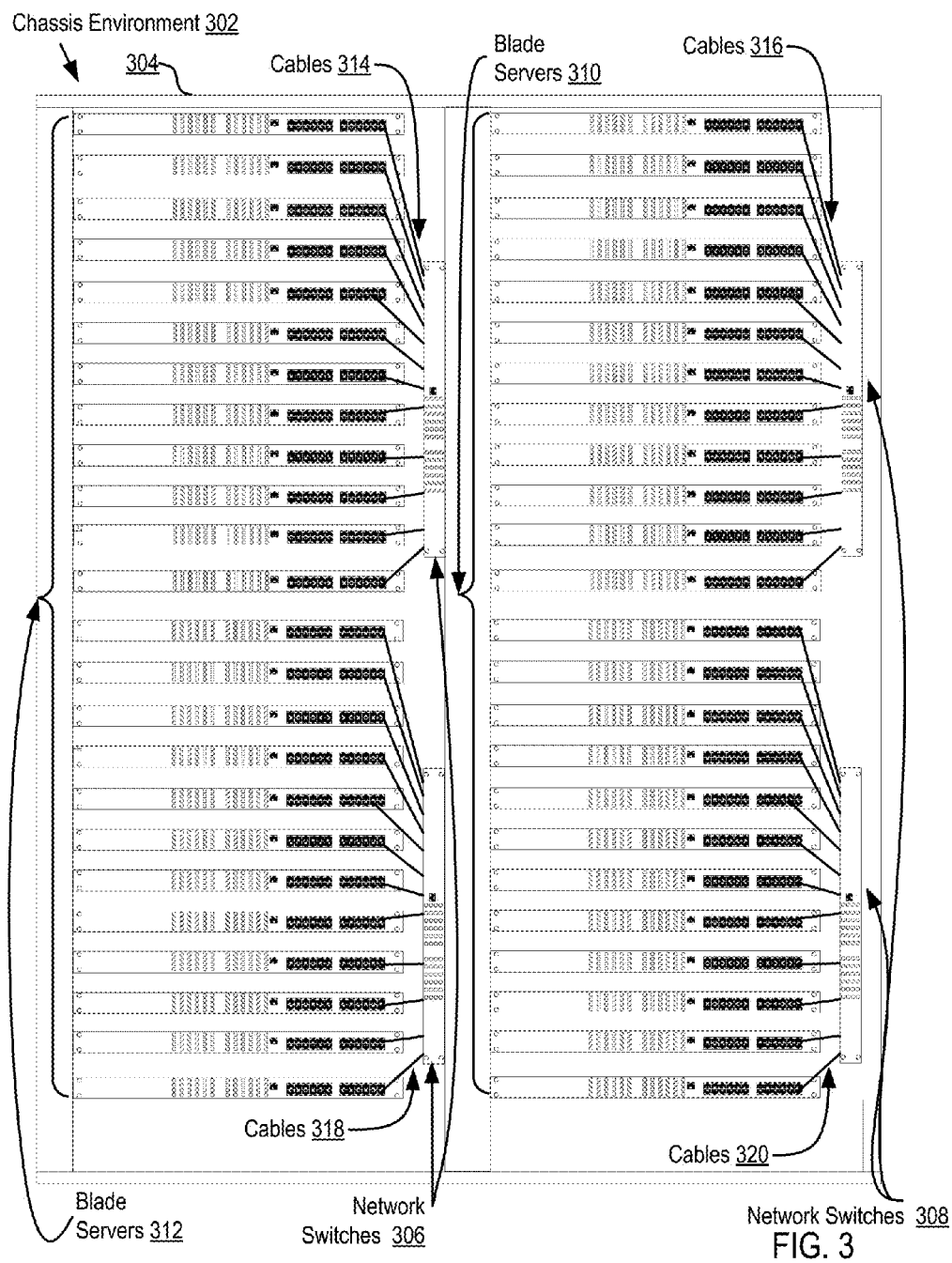
FIG. 3 sets forth a diagram of a chassis environment according to embodiments of the present invention.

For further explanation, FIG. 3 sets forth a diagram of a chassis environment (302) according to embodiments of the present invention. The chassis environment (302) in the example depicted in FIG. 3 is installed in a two-bay chassis and includes a plurality of blade servers (310, 312) and network switches (306, 308) similar to the network switch depicted in FIG. 2. In the chassis environment (302) depicted in FIG. 3, the blade servers (310, 312) are installed in a cabinet bay (304) of the example chassis environment (302). Such blade servers (310, 312) are computing devices implemented in blade form factor. The blade servers (310, 312) may share access to a media tray, a power supply, or other computing components. The blade servers (310, 312) may also be connected to one another and to a chassis management module for data communications through a LAN, which may be embodied as a small network installed within the chassis environment (302).

In the chassis environment (302) depicted in FIG. 3, the blade servers (310, 312) are connected to one of the network switches (306, 308) via data communications cables (314, 316, 318, 320). Readers will appreciate that such cables (314, 316, 318, 320) are coupled to the network switches (306, 308) via a plurality of connector openings on a surface of the switch chassis that is perpendicular to the faceplate of the network switches (306, 308).

Figure 4:
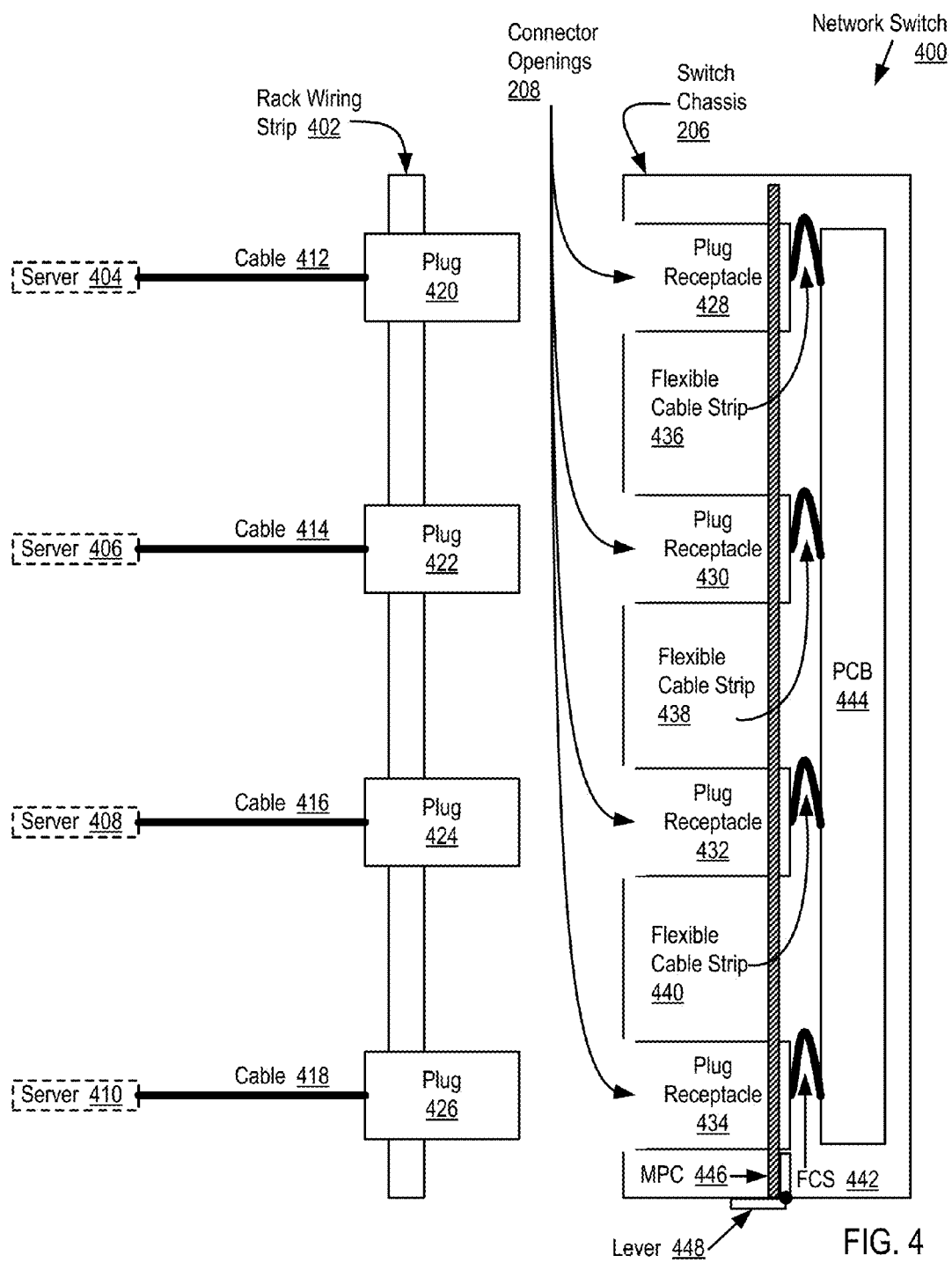
FIG. 4 sets forth a diagram illustrating portions of a rack mountable network switch according to embodiments of the present invention.

For further explanation, FIG. 4 sets forth a diagram illustrating portions of a rack mountable network switch (400) according to embodiments of the present invention. Although not illustrated in FIG. 4, the rack mountable network switch (400) of FIG. 4 can include a faceplate as is illustrated in FIG. 2. The rack mountable network switch (400) of FIG. 4 can also include a switch chassis (206) that is coupled to the faceplate. The switch chassis (206) depicted in FIG. 4 may be embodied as an enclosure, made of metal or another material, for housing the computing components of the rack mountable network switch (400). Such computing components can include, for example, a motherboard, computer processors, network communications hardware, computer memory, memory controllers, computer peripheral devices, and other forms of computer hardware. The switch chassis (206) depicted in FIG. 4 may include a plurality of connector openings (208) on a surface of the switch chassis (206) that is perpendicular to the faceplate, as illustrated in FIG. 2.

The rack mountable network switch (400) of FIG. 4 can also include a plurality of moveable plug receptacles (428, 430, 432, 434) coupled to a PCB (444) mounted inside the switch chassis (206). Such moveable plug receptacles (428, 430, 432, 434) may be embodied, for example, as a plug for receiving an Ethernet cable or other network cable such as an 8 pin 8 contact ('8P8C') female jack, although the moveable plug receptacles (428, 430, 432, 434) may adhere to many standards other than the 8P8C standard in embodiments of the present invention. The moveable plug receptacles (428, 430, 432, 434) may adhere to a predetermined standard, such as the RJ45 standard, such that the information that is received on each pin of the moveable plug receptacles (428, 430, 432, 434) is well known. In such an example, the moveable plug receptacles (428, 430, 432, 434) may be coupled to the PCB (444) mounted inside the switch chassis (206) via a flexible cable strip that includes wiring designed to transmit signals received from a cable that is inserted into a moveable plug receptacle (428, 430, 432, 434) to networking components such as a network adapter that are mounted on or otherwise coupled to the PCB (444).

The moveable plug receptacles (428, 430, 432, 434) depicted in FIG. 4 are 'moveable' in the sense that the moveable plug receptacles (428, 430, 432, 434) can be positioned to extrude from the switch chassis (206) through the connector openings (208) and the moveable plug receptacles (428, 430, 432, 434) can also be positioned to retract into the switch chassis (206) through the connector openings (208). In such an example, the moveable plug receptacles (428, 430, 432, 434) may be coupled to a moveable connector plane or other mechanism that facilitates movement of the moveable plug receptacles (428, 430, 432, 434).

The rack mountable network switch (400) of FIG. 4 can also include a mechanical positioning component (446) coupled to the moveable plug receptacles (428, 430, 432, 434). The mechanical positioning component (446) depicted in FIG. 4 may be embodied, for example, as a plane made out of metal or another material, that is coupled to the moveable plug receptacles (428, 430, 432, 434) such that moving the mechanical positioning component (446) causes the moveable plug receptacles (428, 430, 432, 434) to move. In the example depicted in FIG. 4, the mechanical positioning component (446) is configured to position the moveable plug receptacles (428, 430, 432, 434) to extrude from the switch chassis (206) via the connector openings (208) when the mechanical positioning component (446) is in a first position. The mechanical positioning component (446) is further configured to position the moveable plug receptacles (428, 430, 432, 434) inside the switch chassis (206) when the mechanical positioning component (446) is in a second position. In the example depicted in FIG. 4, the mechanical positioning component (446) is in the second position. The mechanical positioning component (446), however, is coupled to a lever (448) such that moving the lever (448) can cause the mechanical positioning component (446) to move to the first position, as illustrated below with reference to FIG. 5.

Figure 5:
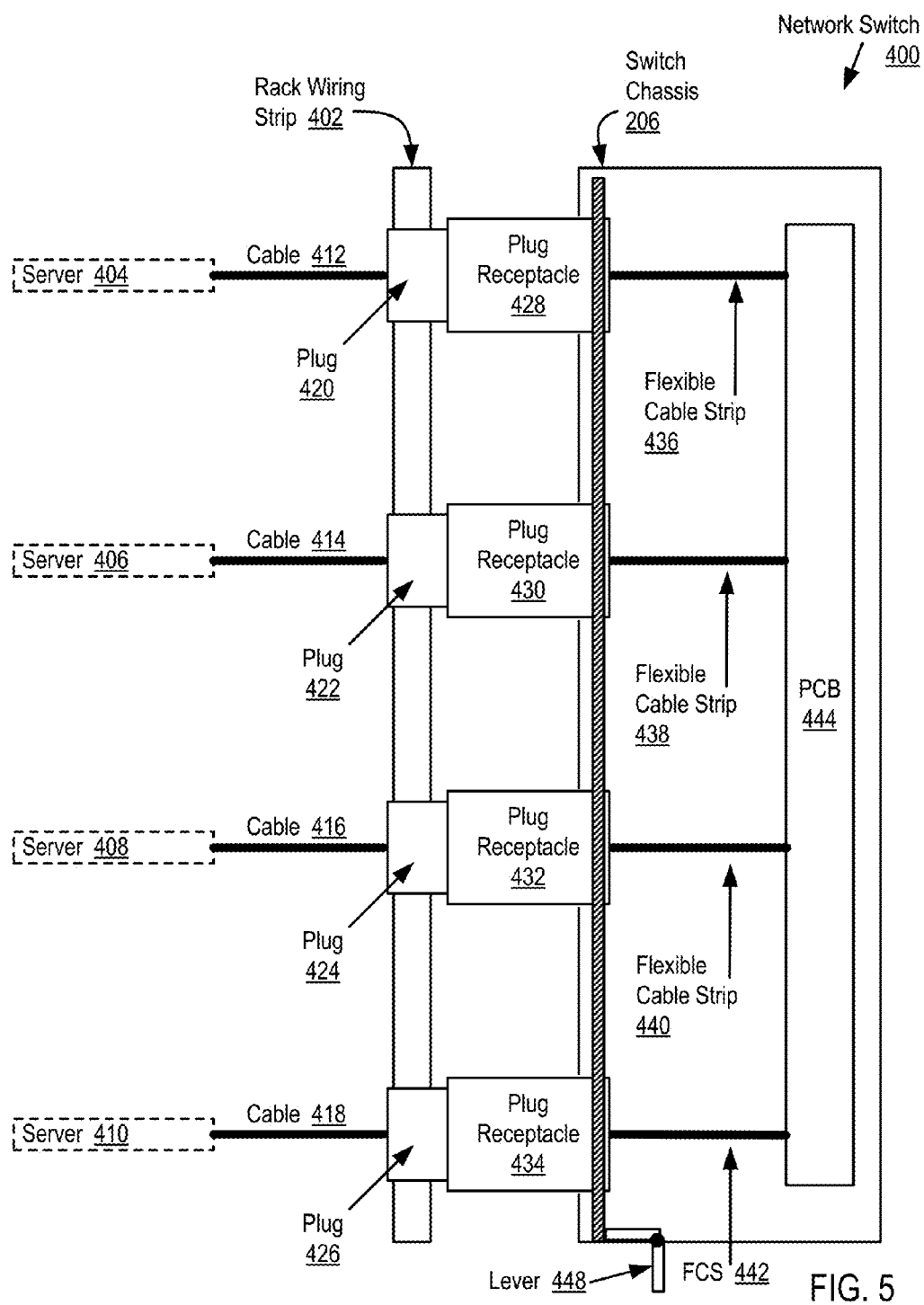
FIG. 5 sets forth a diagram illustrating portions of a rack mountable network switch according to embodiments of the present invention.

For further explanation, FIG. 5 sets forth a diagram illustrating portions of a rack mountable network switch (400) according to embodiments of the present invention. The rack mountable network switch (400) of FIG. 5 is similar to the rack mountable network switch (400) of FIG. 4, as the rack mountable network switch (400) of FIG. 5 can also include a faceplate, a switch chassis (206) that is coupled to the faceplate, a plurality of moveable plug receptacles (428, 430, 432, 434) coupled to a PCB (444) mounted inside the switch chassis (206), and a mechanical positioning component (446) coupled to the moveable plug receptacles (428, 430, 432, 434).

In the example depicted in FIG. 5, however, the mechanical positioning component (446) is in the first position described above, such that the moveable plug receptacles (428, 430, 432, 434) extrude from the switch chassis (206) via the connector openings (208) to connect the moveable plug receptacles (428, 430, 432, 434) to the server cables (412, 414, 416, 418). The mechanical positioning component (446) of FIG. 5 may be placed in the first position by changing the positioning of the lever (448). Readers will appreciate, however, that the position of the mechanical positioning component (446) may be changed through other mechanical means such as, for example, a motorized mechanism, a spring mechanism, a sliding mechanism, and so on.

Figure 6:
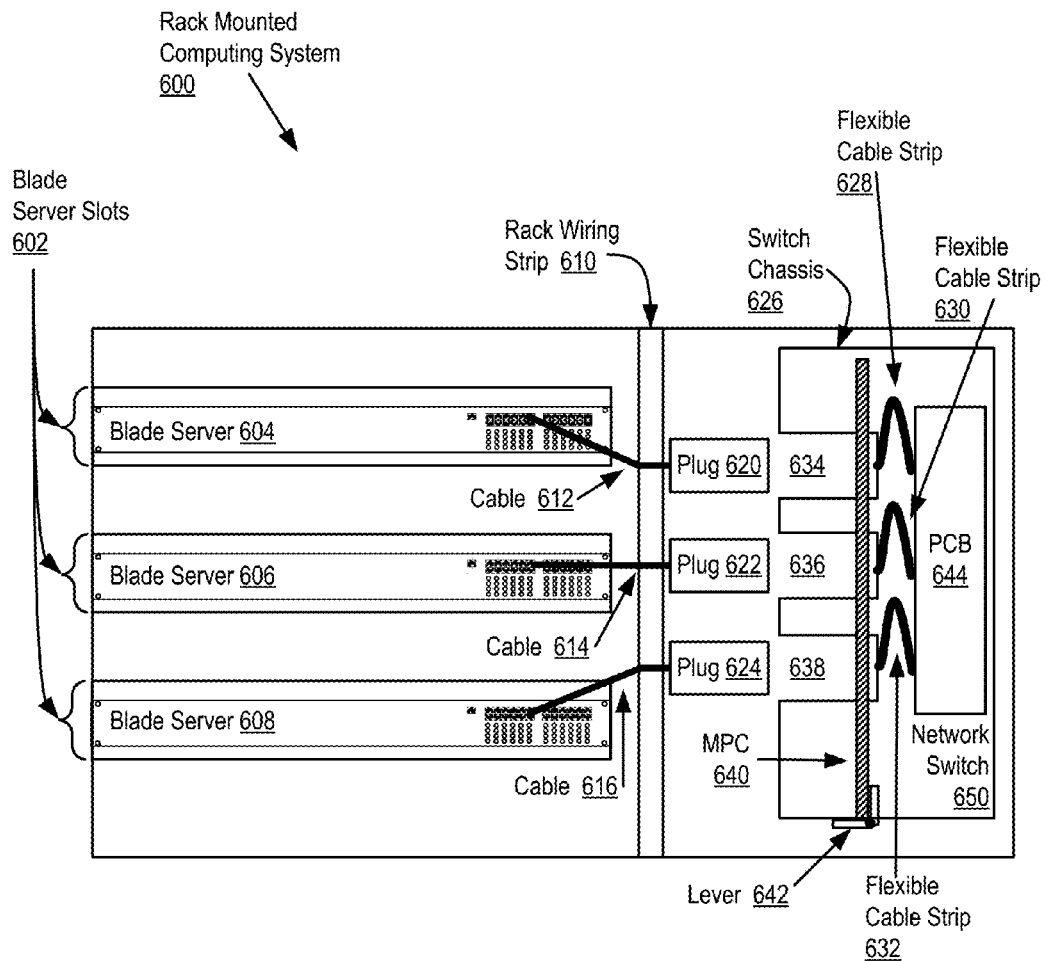
FIG. 6 sets forth a diagram of a rack mounted computing system according to embodiments of the present invention.

For further explanation, FIG. 6 sets for a diagram of a rack mounted computing system (600) according to embodiments of the present invention. The rack mounted computing system (600) depicted in FIG. 6 includes a plurality of blade servers (604, 606, 608) mounted within blade server slots (602). Each blade server slot (602) in FIG. 6 may be embodied, for example, as mechanical components such as a bracket for receiving a blade server (604, 606, 608). Such blade server slots (602) may include physical hardware for receiving a blade server (604, 606, 608) and may also include physical interconnects for coupling the blade servers (604, 606, 608) to other computing components in the rack mounted computing system (600) such as a power supply, a data communications network, a chassis management module, and so on.

The rack mounted computing system (600) depicted in FIG. 6 also includes one or more rack wiring strips (610). Each rack wiring strip (610) can include one or more network cable mounts, which are physical mounts for receiving a network cable. The rack wiring strip (610) may be embodied as a metal bracket or other physical structure mounted within the rack mounted computing system (600). The network cable mounts in the rack wiring strip (610) may be embodied, for example, as a recessed ledge in the rack wiring strip (610) for receiving and securing a network cable.

The rack mounted computing system (600) depicted in FIG. 6 also includes one or more active network cables (612, 614, 616). Each active network cable (612, 614, 616) is active in the sense that each active network cable (612, 614, 616) is coupled on a first end to a blade server (604, 606, 608) and available for connection to networking devices such as a network switch. Each active network cable (612, 614, 616) in FIG. 6 is inserted into a network cable mount of the rack wiring strip (610). Readers will appreciate that in view of the fact that each active network cable (612, 614, 616) in FIG. 6 is inserted into a network cable mount of the rack wiring strip (610), a plug (620, 622, 624) such as an 8P8C plug for each active network cable (612, 614, 616) is available to be received by a network switch (650). Readers will appreciate, however, that the plugs (620, 622, 624) may adhere to many standards other than the 8P8C standard in embodiments of the present invention.

The rack mounted computing system (600) depicted in FIG. 6 also includes a rack mountable network switch (650) as described above. The rack mountable network switch (650) of FIG. 6 includes: a faceplate; a switch chassis (626) coupled to the faceplate, the switch chassis (626) including a plurality of connector openings on a surface of the switch chassis (626) that is perpendicular to the faceplate; a plurality of moveable plug receptacles (634, 636, 638) coupled to a PCB (644) mounted inside the switch chassis (626); and a mechanical positioning component (640) coupled to the moveable plug receptacles (634, 636, 638), the mechanical positioning component (640) configured to position the moveable plug receptacles to extrude from the switch chassis (626) via the connector openings when the mechanical positioning component (640) is in a first position, the mechanical positioning component (640) further configured to position the moveable plug receptacles (634, 636, 638) inside the switch chassis (626) when the mechanical positioning component (640) is in a second position. The rack mountable network switch (650) of FIG. 6 includes also includes a lever (642) and a plurality of flexible cable strips (628, 630, 632) as described above.

Figure 7:
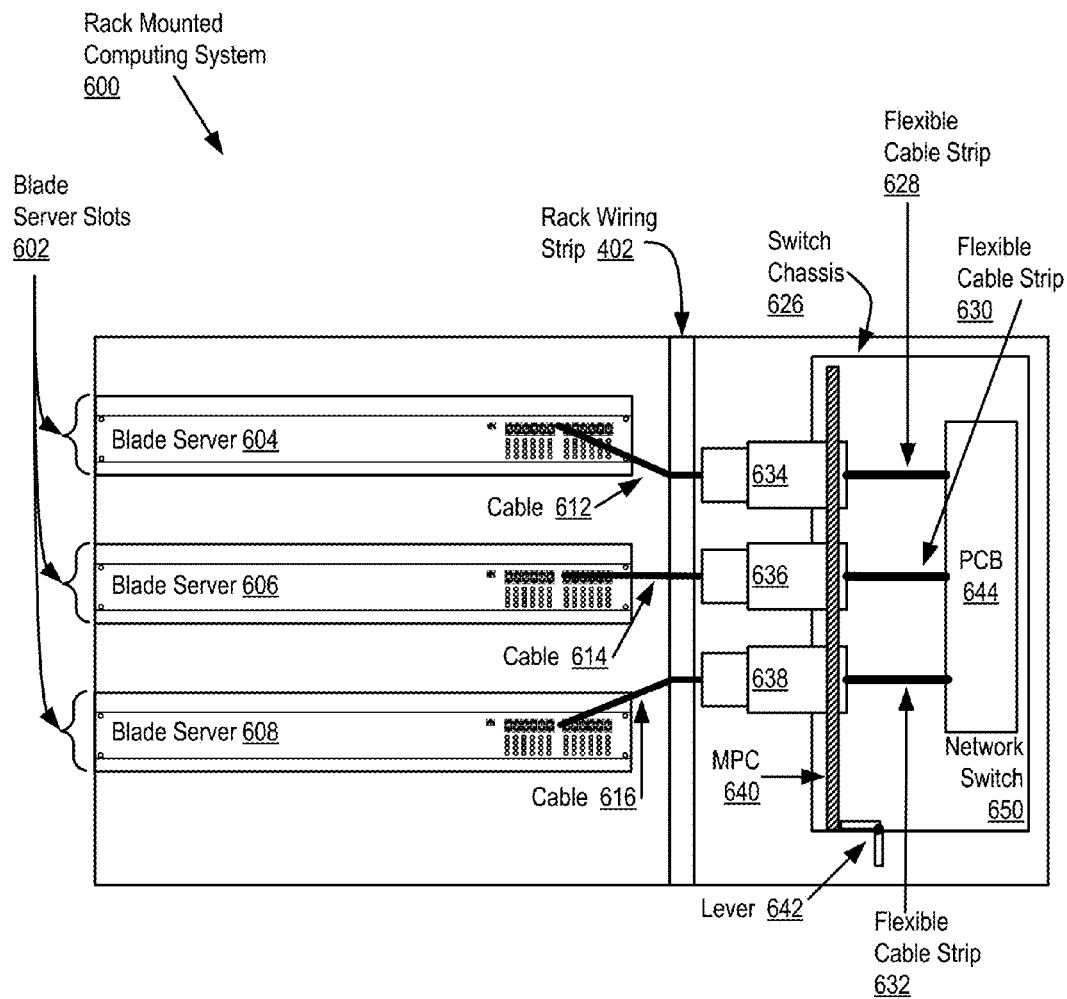
FIG. 7 sets forth a diagram of a rack mounted computing system according to embodiments of the present invention.

For further explanation, FIG. 7 sets for a diagram of a rack mounted computing system (600) according to embodiments of the present invention. The rack mounted computing system (600) of FIG. 7 is similar to the rack mounted computing system (600) depicted in FIG. 6, as the rack mounted computing system (600) depicted in FIG. 7 also includes: a lever (642), a plurality of flexible cable strips (628, 630, 632), and a faceplate; a switch chassis (626) coupled to the faceplate, the switch chassis (626) including a plurality of connector openings on a surface of the switch chassis (626) that is perpendicular to the faceplate; a plurality of moveable plug receptacles (634, 636, 638) coupled to a PCB (644) mounted inside the switch chassis (626); and a mechanical positioning component (640) coupled to the moveable plug receptacles (634, 636, 638), the mechanical positioning component (640) configured to position the moveable plug receptacles to extrude from the switch chassis (626) via the connector openings when the mechanical positioning component (640) is in a first position, the mechanical positioning component (640) further configured to position the moveable plug receptacles (634, 636, 638) inside the switch chassis (626) when the mechanical positioning component (640) is in a second position, as described above.

Readers will appreciate, however, that in the example depicted in FIG. 7 the mechanical positioning component (640) is in the first position described above, such that the moveable plug receptacles (634, 636, 638) extrude from the switch chassis (626) via the connector openings. The mechanical positioning component (640) of FIG. 7 may be placed in the first position by changing the positioning of the lever (642). Readers will appreciate, however, that the position of the mechanical positioning component (640) may be changed through other mechanical means such as, for example, a motorized mechanism, a spring mechanism, a sliding mechanism, and so on.

Readers will appreciate that in view of the embodiments described above, network cables that are coupled to a blade server may be inserted into a rack wiring strip of a rack, such that the cables are secured and available to be received by a network switch. By moving a mechanical positioning component of such a network switch to the first position, moveable plug receptacles can extrude from the switch chassis of the network switch, causing the moveable plug receptacles to receive the network cables that inserted into the rack wiring strip of the rack. In such an example, when a switch needs to be replaced, the mechanical positioning component the network switch may be moved into the second position, thereby causing the moveable plug receptacles to disconnect from the network cables that inserted into the rack wiring strip of the rack and retract into the switch chassis of the network switch. In such a way, removing a network switch can be facilitated my merely changing the position of the mechanical positioning component of the switch and pulling the switch out of the rack. Installing a new switch can also be accomplished by merely inserting the switch into the rack and changing the position of the mechanical positioning component of the switch.

The arrangement of devices making up the examples illustrated in FIG. 2-7 are for explanation, not for limitation. In particular, readers will appreciate that although the examples described above refer to 'blade servers' as being coupled to network switches, any network-enabled integrated technology element that is inserted into a rack may also be coupled to such network switches. Furthermore, apparatuses useful according to various embodiments of the present invention may include additional servers, routers, and other devices, not shown in the above Figures, as will occur to those of skill in the art. Various embodiments of the present invention may be implemented on a variety of hardware platforms in addition to those illustrated in FIGS. 2-7.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A rack mountable network switch, the rack mountable network switch comprising:
   a faceplate;
   a switch chassis coupled to the faceplate, the switch chassis including a plurality of connector openings on a surface of the switch chassis that is perpendicular to the faceplate;
   a plurality of moveable plug receptacles coupled to a printed circuit board ('PCB') mounted inside the switch chassis, wherein each moveable plug receptacle is coupled to the PCB mounted inside the switch chassis via a flexible cable strip, and wherein the flexible cable strip transmits signals from a cable inserted into one of the plurality of movable plug receptacles to the PCB mounted inside the switch chassis; and
   a mechanical positioning component coupled to the moveable plug receptacles, wherein the mechanical positioning component positions the moveable plug receptacles to extrude from the switch chassis via the connector openings when the mechanical positioning component is in a first position, and wherein the mechanical positioning component positions the moveable plug receptacles inside the switch chassis when the mechanical positioning component is in a second position.

2. The rack mountable network switch of claim 1 wherein the mechanical positioning component is a lever.

3. The rack mountable network switch of claim 1 wherein the mechanical positioning component includes a motor.

4. The rack mountable network switch of claim 1 wherein each moveable plug receptacle is coupled to a moveable connection plane.

5. The rack mountable network switch of claim 4 wherein the mechanical positioning component is coupled to the moveable connection plane.

6. The rack mountable network switch of claim 1 wherein each of the moveable plug receptacles includes an 8 position 8 contact ('8P8C') female jack.

7. A rack mounted computing system, the rack mounted computing system including:
   a plurality of blade servers mounted within blade server slots;
   one or more rack wiring strips, each rack wiring strip including one or more network cable mounts;
   one or more active network cables, each active network cable coupled on a first end to one of the plurality of blade servers, each active network cable inserted into one of the one or more network cable mounts; and
   rack mountable network switch comprising:
      a faceplate;
      a switch chassis coupled to the faceplate, the switch chassis including a plurality of connector openings on a surface of the switch chassis that is perpendicular to the faceplate;
      a plurality of moveable plug receptacles coupled to a printed circuit board ('PCB') mounted inside the switch chassis, wherein each moveable plug receptacle is coupled to the PCB mounted inside the switch chassis via a flexible cable strip, and wherein the flexible cable strip transmits signals from a cable inserted into one of the plurality of movable plug receptacles to the PCB mounted inside the switch chassis; and
      a mechanical positioning component coupled to the moveable plug receptacles, wherein the mechanical positioning component positions the moveable plug receptacles to extrude from the switch chassis via the connector openings when the mechanical positioning component is in a first position, and wherein the mechanical positioning component positions the moveable plug receptacles inside the switch chassis when the mechanical positioning component is in a second position.

8. The rack mounted computing system of claim 7 wherein the mechanical positioning component is a lever.

9. The rack mounted computing system of claim 7 wherein the mechanical positioning component includes a motor.

10. The rack mounted computing system of claim 7 wherein each moveable plug receptacle is coupled to a moveable connection plane.

11. The rack mounted computing system of claim 10 wherein the mechanical positioning component is coupled to the moveable connection plane.

12. The rack mounted computing system of claim 7 wherein each of the moveable plug receptacles includes an 8 position 8 contact ('8P8C') female jack.

13. The rack mounted computing system of claim 7 wherein a second end of each active network cable is coupled to the network switch.

* * * * *